(12) United States Patent
Feinsod et al.

(10) Patent No.: US 7,872,740 B2
(45) Date of Patent: Jan. 18, 2011

(54) MOTION-COMPENSATED LIGHT-EMITTING APPARATUS

(76) Inventors: Matthew Feinsod, 4F Nassau Dr., Great Neck, NY (US) 11021; Michael Perlmutter, 19 Peckham Hill Rd., Sherborn, MA (US) 01770

(*) Notice: Subject to any disclaimer, the term of this patent is extended or adjusted under 35 U.S.C. 154(b) by 0 days.

(21) Appl. No.: 12/761,691

(22) Filed: Apr. 16, 2010

(65) Prior Publication Data
US 2010/0202031 A1 Aug. 12, 2010

Related U.S. Application Data

(60) Division of application No. 12/043,852, filed on Mar. 6, 2008, now Pat. No. 7,728,964, which is a continuation-in-part of application No. 11/315,906, filed on Dec. 22, 2005, now abandoned, which is a continuation-in-part of application No. 11/022,215, filed on Dec. 23, 2004, now Pat. No. 7,312,863.

(51) Int. Cl.
G01C 1/10 (2006.01)
G01C 21/02 (2006.01)
G01C 21/24 (2006.01)
G01J 1/20 (2006.01)

(52) U.S. Cl. .................. 356/149; 250/201.1; 250/206.2

(58) Field of Classification Search .................. 356/149; 359/554–557; 250/201.1, 206.1, 206.2, 234, 250/235
See application file for complete search history.

(56) References Cited

U.S. PATENT DOCUMENTS

| | | | |
|---|---|---|---|
| 3,781,121 A * | 12/1973 | Gross .......................... 356/247 |
| 4,701,602 A | 10/1987 | Schaefer et al. |
| 5,004,344 A | 4/1991 | Tazartes et al. |
| 5,368,271 A | 11/1994 | Kiunke et al. |
| 5,669,580 A | 9/1997 | Strauss |
| 5,689,369 A * | 11/1997 | Noguchi ....................... 359/557 |
| 6,288,381 B1 * | 9/2001 | Messina ................... 250/201.1 |
| 6,359,681 B1 | 3/2002 | Housand et al. |
| 6,653,611 B2 * | 11/2003 | Eckelkamp-Baker et al. ...... 250/201.1 |
| 6,700,109 B2 * | 3/2004 | Eckelkamp-Baker et al. ...... 250/203.1 |
| 6,768,944 B2 * | 7/2004 | Breed et al. ................... 701/301 |
| 7,292,319 B1 * | 11/2007 | Carter et al. ................... 356/29 |
| 7,312,863 B2 * | 12/2007 | Feinsod et al. ............... 356/149 |
| 2004/0182997 A1 * | 9/2004 | Green .................... 250/227.14 |
| 2005/0128749 A1 * | 6/2005 | Wilson et al. ................ 362/259 |
| 2005/0161578 A1 * | 7/2005 | Eckelkamp-Baker et al. ...... 250/201.1 |
| 2006/0139930 A1 * | 6/2006 | Feinsod et al. ............... 362/276 |
| 2007/0023527 A1 * | 2/2007 | Harley et al. ............ 235/462.45 |
| 2007/0176851 A1 * | 8/2007 | Willey et al. .................... 345/32 |

* cited by examiner

Primary Examiner—Patrick J Connolly
(74) Attorney, Agent, or Firm—Dickstein Shapiro LLP

(57) ABSTRACT

A light-emitting apparatus, for enabling a beam of light to be projected on a desired target located a distance away to project the beam on the desired target without any or substantially any undesired movement. The apparatus may include a housing, a light generating device located within the housing and operable to generate a beam of light, a sensing device or devices for sensing an undesired action of the housing, a control circuit operable to provide a control signal corresponding to the sensed undesired action, and a drive device operable to counter act all or at least some of the undesired action of said housing in accordance with said control signal. The sensing device or devices may be one or more gyroscopes, accelerometers or other such devices.

11 Claims, 11 Drawing Sheets

MOTION-COMPENSATED LIGHT-EMITTING APPARATUS

CROSS REFERENCE TO RELATED APPLICATIONS

This application is a divisional of U.S. patent application Ser. No. 12/043,852, filed Mar. 6, 2008, entitled "Motion-Compensated Light-Emitting Apparatus" which in turn is a continuation-in-part of U.S. patent application Ser. No. 11/315,906, filed Dec. 22, 2005, entitled Motion-Compensating Light Emitting Apparatus, which in turn is a continuation-in-part of U.S. patent application Ser. No. 11/022,215, now U.S. Pat. No. 7,312,863, filed Dec. 23, 2004, entitled Motion-Compensating Light-Emitting Apparatus, all of which are incorporated by reference herein.

FIELD OF THE INVENTION

The present invention relates generally to a system for maintaining a beam of electromagnetic radiation, such as visible light, pointed in a particular direction, despite unwanted movement of the device emitting the beam with respect to an inertial frame of reference.

BACKGROUND OF THE INVENTION

The present invention relates to light-emitting devices and particularly to those devices intended to produce a beam in a selected direction such as toward a target of interest. The invention provides motion-compensation technology suitable for use with such light-emitting devices, which may dampen and/or substantially eliminate the effect of unintentional motion, vibration, or movements, such as angular and/or translational movements, caused by mechanical vibrations, hand tremors, and so forth.

Light-emitting devices, such as laser diode devices, are used in a variety of consumer, computer, business, medical, scientific, military, outdoor, telecommunication and industrial products, including but not limited to compact disk (CD) players and computer CD-ROM drives, digital video disk (DVD) players and DVD-ROM drives, laser printers, laser pointers, barcode scanners, measurement devices, rangefinders, scopes, industrial material processing devices, marking and cutting systems, medical equipment, fiber optic transmission systems, satellite communications, and digital printing presses. Many of these applications require precision accuracy for successful implementation. However, conventional light-emitting devices may be affected by unintentional angular and/or translational movements (e.g., fine vibrations from the machine in which a laser is encased, fine tremors from a shaking hand holding a laser, etc.) and, as a result, generate an unsteady column of light—producing an effect that may cause inferior performance.

An example of the above mentioned effect will now be described with reference to a laser pointer. Fine tremors of the human hand, when holding even a lightweight laser pointer (or other pointing device), have been measured at a frequency range of 1 to 5 Hz. These unwanted vibrations are often amplified when the person maneuvering the device is nervous. The resulting deviation of the projected spot from the intended target point to the actual point is proportional to the distance from the pointing device to the target object (e.g., a point on a screen). This deviation may be approximately equal to the product of the sine or the tangent of the angle and the distance to the projected spot. In other words, for small angular movements (such as less than 10 degrees), the movement of the projected spot is approximately equal to the product of the distance to the target and the angle of the movement (in radians). For instance, small angular movements of +/−1 degree of a laser pointing device may result in movements of approximately +/−2 cm of the projected spot on a target 1 meter away; and, these angular movements will result in a 10-fold larger projected spot movement (approximately +/−20 cm) for a target 10 meters away (which may be typical of large lecture halls). In contrast to angular movements, translational movements (sideways movements of the hand) are not amplified by the distance from the light-emitting device to the target object. That is, if the hand holding a laser pointer is moved sideways by 1 cm, the spot on the target is also moved sideways by 1 cm irrespective of how far the target is from the hand.

BRIEF SUMMARY OF THE INVENTION

The present invention provides a motion-compensated, light-emitting apparatus which enables a steady beam of light to be projected onto a desired target even if subjected to undesired unsteady conditions by automatically redirecting or compensating for unintentional, off-target angular and/or translational movements. The present apparatus may use miniature gyroscopes and/or accelerometers and/or other motion sensing type devices and an optical system including light-refracting elements arranged within the apparatus. In a preferred embodiment of the present invention, a motion-compensating light-emitting device is provided which utilizes a mirror mounted on a cantilever composed of an aluminum and Lead Zirconium Titanate (PZT) metal sandwich. In a preferred embodiment, the mirror, positioned by the cantilever, deflects the light beam to compensate for the unwanted tremor based on the angular rates and/or translational motion measured by two or more motion sensors.

In an alternate embodiment of the present invention, a motion-compensated, light-emitting device utilizes a micro mirror in a two axis Micro-Electronic Mechanical System (MEMS)-based, gimbal-less scanning mirror device. In a preferred embodiment, a commercially available MEMS, made entirely of monolithic single-crystal silicon in a single miniature package, changes a mirror angle in two deflection axes. When an electric field is applied to the preferred two axis MEMS, the mirror surface tilts an amount that is proportional to the applied voltage to stabilize the direction of the emitted light beam.

In an alternate embodiment of the present invention a motion compensated, light-emitting device is provided that displays a variety of stabilized-rasterized and stabilized-vector graphics as well as stabilized multi-frame animations at arbitrary refresh rates. The system is highly adaptable to projection onto various surfaces and in a variety of applications, including projection onto specially-coated transparent surfaces. Due to the low power consumption and vibration stabilized output of this device, the system preferably is miniaturized, highly portable and fully mobile when used with a laptop small computer. The computer may project different letters, symbols, or graphics or other static or moving images that can change and evolve over time. The system preferably includes a two axis MEMS micro mirror. The signals providing the desired rasterized or vector graphics are added to the vibration stabilization signals, and unwanted movement is reduced or eliminated in the resulting projection.

In an alternate embodiment of the present invention, a motion-compensated, light-emitting device displays full color, high-quality images that remain in focus at all distances using holographic laser projection technology. The term "holographic" refers not to the projected image, but to the method of projection. A diffraction pattern of the desired 2D image, calculated using holographic algorithms, is displayed on a phase-modulating Liquid Crystal on Silicon (LCOS) microdisplay attached to a two axis MEMS micro mirror. When illuminated by coherent laser light, the desired image is projected on various surfaces without distortion by the micro-tremors imposed on the projection system.

Rather than blocking light, a phase-modulating LCOS microdisplay mounted on the MEMS micro mirror steers light to exactly where it is needed, making the system highly efficient. Unlike conventional projection systems, a projection lens is not needed. Instead, a demagnification lens pair expands the diffracted image from the microdisplay, producing an ultra-wide throw angle, greater than 100°. The projected images are in focus at all distances from the projector, eliminating the need for focus control.

The diffractive method of projection naturally lends itself to miniaturization and low cost implementation, allowing images to be projected onto curved and angled surfaces without distortion. In addition, the system is highly tolerant of microdisplay pixel failure—essential in safety critical applications in markets such as automotive.

In an alternate embodiment of the present invention a motion-compensated, light-emitting device stores the exact orientation of the laser or projection system for later retrieval, derived from a location determination system, a range to target determination system and information from motion detection devices such as accelerometers under user control. The system automatically maintains a light beam emitted from the device in the exact orientation, as stored. In addition, the system may store several orientations, and the system can reorient the light beam in sequential, round-robin fashion. With sufficient displacement of the compensating mirrors, the system can be moved from its location, and if the targets are far enough away, the system can maintain the orientation of the light beam at the marked targets. In addition, by adding some simple modulation to the laser light beams the beams can be turned off when not actually pointing at memorized locations, thus maintaining illumination only at the desired locations that were previously set in memory.

In one aspect, the present invention is directed to a light-emitting apparatus comprising: a light beam generator that emits a light beam; a device that produces a first signal indicating motion of the generator; an integrator that integrates the first signal to produce a second signal indicating movement of the light beam generator; and a light diverting device mounted to an electronically adjustable cantilever; wherein the second signal is applied to the cantilever so that the light beam projects substantially in a particular direction.

In another aspect of the present invention, the cantilever comprises a first layer of ceramic and a second layer of lead zirconium titanate.

In another aspect of the present invention, the apparatus further comprises first and second angular rate-sensing devices; and first and second cantilevers; wherein the first angular rate-sensing device measures pitch angular velocity and the second angular rate-sensing device measures yaw angular velocity, the integrator integrates signals produced by both first and second signals and the integrated signals are applied to the first and second cantilevers, respectively.

In another aspect of the present invention, the apparatus further comprises a graphics generator that generates a third signal; and a signal combiner that combines the first and second signals with the third signal; wherein the third signal, applied to the cantilevers, diverts the light beam to project an image.

In another aspect of the present invention, the apparatus further comprises a user interface that selects a current orientation of the generator; and a memory that stores the current orientation; wherein the apparatus maintains the light beam projected at the current orientation.

In another aspect of the present invention, the apparatus further comprises a measurement device that generates a third signal representative of a measured orientation and wherein the memory further stores the measured orientation.

In another aspect of the present invention, the measurement device comprises a digital magnetometer and the measured orientation is azimuth.

In another aspect of the present invention, the memory stores more than one orientation and the apparatus directs the beam in a sequence of one or more directions from the orientations stored in the memory.

In another aspect of the present invention, the light diverting device comprises a mirror.

In another aspect of the present invention, the light diverting device comprises a lens.

In another aspect of the present invention, the integrator integrates the first signal to produce a second signal that indicates an angular and translational movement of the light beam generator; and; wherein the second signal is applied to the cantilever so that angular and translational movement is substantially eliminated.

In another aspect, the present invention is directed to a light-emitting apparatus comprising: a light beam generator that emits a light beam; a motion-sensing device that produces a first signal indicating movement of the generator; an integrator that integrates the first signal to produce a second signal indicating a movement of the light beam generator; and a micro electronic mechanical system that positions a light diverting device; wherein the second signal is applied to the micro electronic mechanical system to project the beam substantially in a particular direction.

In another aspect of the present invention, the light diverting device comprises a mirror.

In another aspect of the present invention, the light diverting device comprises a lens.

In another aspect of the present invention, the apparatus further comprises first and second angular rate-sensing devices; wherein the first angular rate-sensing device measures pitch angular velocity and the second angular rate-sensing device measures yaw angular velocity, the integrator integrates signals produced by both first and second signals and the integrated signals are applied to the micro electronic mechanical system.

In another aspect of the present invention, the apparatus further comprises a graphics generator that generates a third signal; and a signal combiner that combines the first and second signals with the third signal; wherein the third signal, applied to the micro electronic mechanical system, diverts the light beam to project an image.

In another aspect of the present invention, the integrator integrates the first signal to produce a second signal that indicates an angular and translational movement of the light beam generator; and; wherein the second signal is applied to the micro electronic mechanical system to project the beam so that angular and translational movement is substantially eliminated.

In another aspect of the present invention, the apparatus further comprises a user interface that selects a current orientation of the generator; and a memory that stores the current orientation; wherein the apparatus maintains the light beam projected at the current orientation.

In another aspect of the present invention, the apparatus further comprises a measurement device that generates a third signal representative of a measured orientation and wherein the memory further stores the measured orientation.

In another aspect of the present invention, the measurement device comprises a digital magnetometer and the measured orientation is azimuth.

In another aspect of the present invention, the memory stores more than one orientation and the apparatus directs the beam in a sequence of one or more directions from the orientations stored in the memory.

In another aspect of the present invention, the apparatus further comprises a plurality of colored lasers; and a laser collimating device that combines the plurality of colored lasers into a single beam; wherein the light beam generator comprises the plurality of colored lasers; and wherein the light diverting device comprises a micro display that generates an image from the single beam.

DETAILED DESCRIPTION OF THE INVENTION

Figure 1:
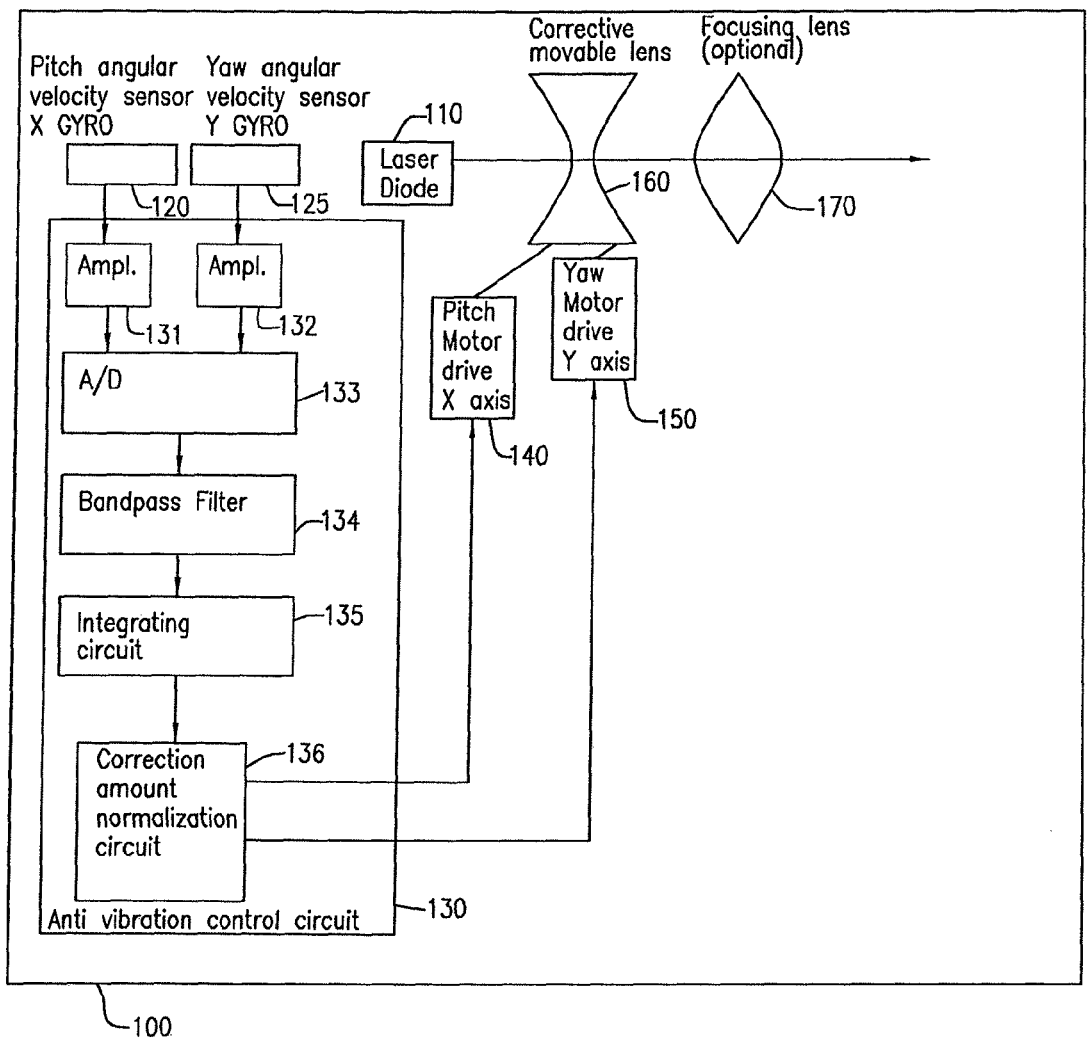
FIG. 1 is a diagram of a motion-compensating light-emitting apparatus according to an embodiment of the present invention.

FIG. 1 is a diagram of a laser diode pointer 100 which includes vibration or motion compensation circuitry in accordance with an embodiment of the invention. A visible laser diode 110 may be used as the light source. There are several ways of implementing the vibration compensation scheme. In accordance with an embodiment of the invention, two angular velocity sensors (gyros) 120 and 125 are aligned in orthogonal directions and used to measure the angular movements in the pitch and yaw axis (also referred to as the X and Y axis). In a preferred embodiment, the two miniature gyroscopes comprise, for example, a micro electro mechanical system ("MEMS"), such as model ADXRS150 manufactured by Analog Devices, Inc. These gyros may have a relatively small volume (such as less than $0.15$ $cm^3$), low weight (such as less than 500 mg), and small size (such as 7 mm×7 mm×3 mm or less). In another embodiment of the present invention, a motion-compensating light-emitting device is provided which utilizes two or three miniature accelerometers (for example, MEMS, such as model ADXL203 manufactured by Analog Devices, Inc.) arranged to measure acceleration and changes of the gravity vector (changes in acceleration) or relative tilts with respect to the vertical axis in two orthogonal directions (i.e., yaw and pitch) and to obtain from this information the relative vertical and horizontal angular movements and translational movements. These accelerometers may have a relatively small volume $0.05$ $cm^3$ (with dimensions of 0.5 cm×0.5 cm×0.2 cm). Additionally, the accelerometers may be provided in a hermetically sealed package.

The output of gyros 120 and 125 are amplified by two amplifiers 131 and 132 respectively and/or sampled by an A/D converter 133 in anti-vibration control circuit 130. The sampled signal may be passed to a band frequency filter 134 where the portion of the signal associated with the rapid, unwanted angular motions of the pointer in this example, typically that portion between 1 and 5 Hz, is extracted. Although a band frequency filter having a range of 1 to 5 Hz is described, a variable frequency filter may be used to set the desired band of frequencies. The range of frequencies may be adjusted by utilizing an adjustment type device such as a variable resistor or digital switches.

The filtered signal may then be integrated by an integrating processor circuit 135. Because gyros 120 and 125 measure angular velocity, the signal received by integrating processor circuit 135 may be integrated to obtain angular information from which an angular difference may be obtained. Although the embodiment of FIG. 1 utilizes gyros 120 and 125 that measure angular velocity, gyros 120 and 125 may measure an angular difference. In such instance, integrating processor circuit 135 may not be included in the anti-vibration control circuit 130.

The integrated rate output or angular difference (proportional to the angle of the unwanted angular motion) may be conditioned by a correction amount normalization circuit 136 (which may include amplifying the signal by a necessary or predetermined amount) and supplied as an input for motors 140 and 150, which may be connected to a movable lens 160 (which may be located between the laser diode 110 and a focusing lens 170). Movable lens 160 and focusing lens 170 may each be constructed from one or more convex lenses and/or concave lenses, or a combination of convex and concave lenses, or one or more convex/concave type lenses, or any combination thereof. The signals may be conditioned so that the feedback loops provide an input signal to the motion correction mechanisms such that the resulting circuits are stable in the region of interest. The conditioning may include adjusting the gain of the signal as well as adjusting for the null of the circuit and the zero offset of the gyros. Thus, if the integrated rate output measured is equal to 1 degree, the amplified signal has to equal a voltage (or current) that will produce a motor movement required to move the compensating lens for a one degree of motion.

The anti-vibration control circuit 130 may be part of a microprocessor or microcomputer, or could be constructed out of individual analog and digital elements depending on the cost, size and power consumption of each implementation. Additionally, an on/off switch may be provided in laser diode pointer 100 which may enable a user to turn off the anti-vibration control circuit if the user does not want to use the motion compensating function.

Figure 2:
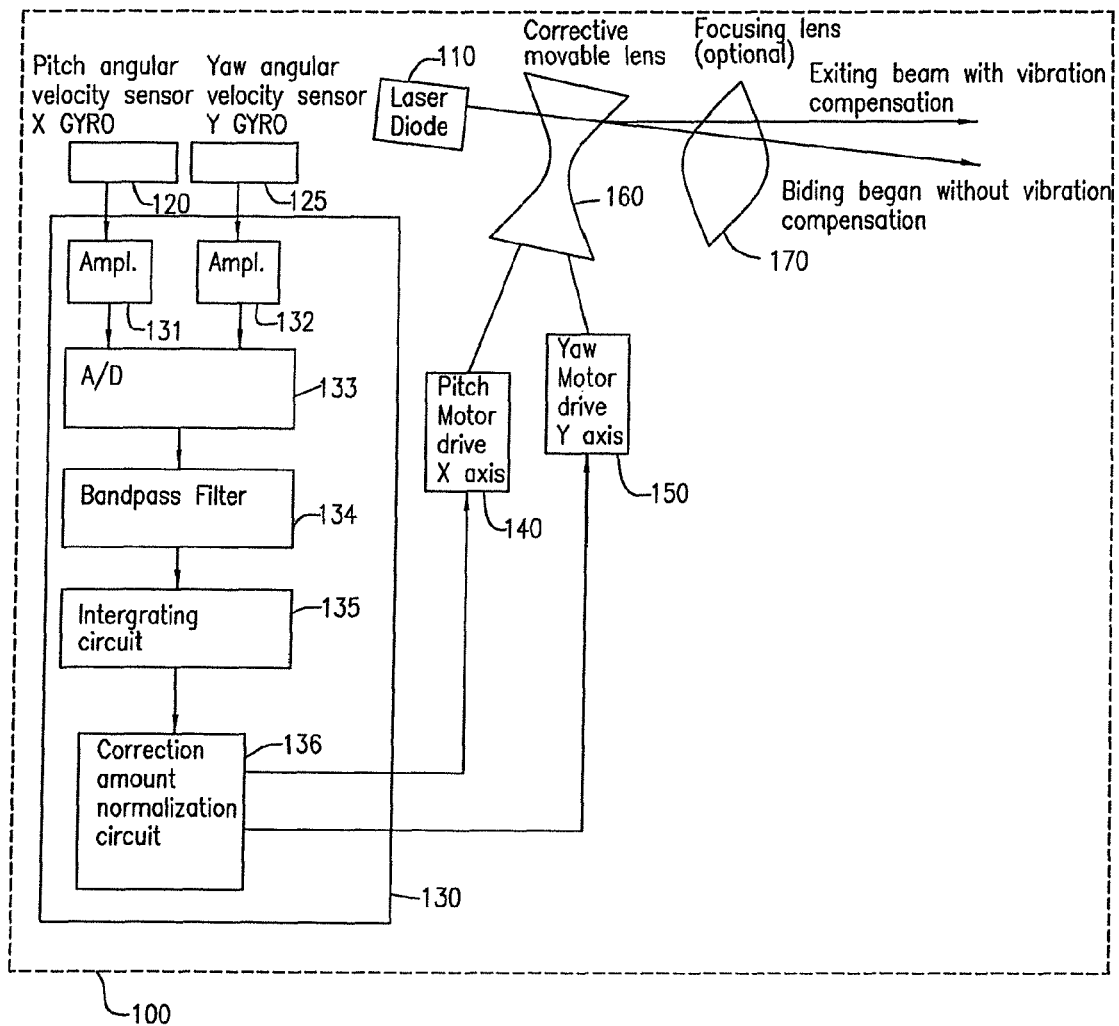
FIG. 2 is a diagram of the motion-compensating light-emitting apparatus of FIG. 1 to which reference will be made in explaining the operation thereof.

FIG. 2 is a diagram of a laser diode pointer 100 when it is tilted down. The gyros 120 and 125 may measure the angular velocity of the tilt, and their output signals (which may be in analog form) are proportional to the angular rate of the motion. Such signals may then be amplified, digitized and passed to the band pass frequency filter 134. The band frequency filter 134 may extract the portion of the signal(s) associated with rapid unwanted angular motion (e.g. unwanted hand tremors which may be in the 1 to 5 Hz range). The filtered signal may then be integrated by the integrating processor circuit 135. The normalizing and conditioning circuit 136 may receive the integrated signal and, in accordance therewith, may generate a voltage or current signal having a value or magnitude corresponding to the necessary compensation, and may cause the same to be supplied to compensating element(s) (such as motors 140 and 150). In response thereto, the motors 140 and 150 may cause the corrective lens 160 to move in a direction such that an exiting beam continues to exit the laser pointer 100 in a horizontal or a substantially horizontal direction. Without the movement of this corrective movable lens 160 the beam would exit at a downward angle. The motors 140 and 150 may be an electro-motor, an electromagnetic motor, a piezo-electric motor or any other type of actuator suited for this application.

Although not shown in this diagram, laser pointer 100 (which includes the gyros and the anti-vibration circuit) may be powered by a power source such as two 1.5V batteries connected in series as used for ordinary laser pointers. To save on power usage, the motion-compensation technology may be activated only upon activation of the laser pointer.

Although FIG. 2 depicts a laser diode pointer 100 tilted on one axis and its resulting compensation, tilting on the other axis would be compensated similarly (and independently) and is not illustrated in order to keep the drawings simple and easy to follow.

Figure 3:
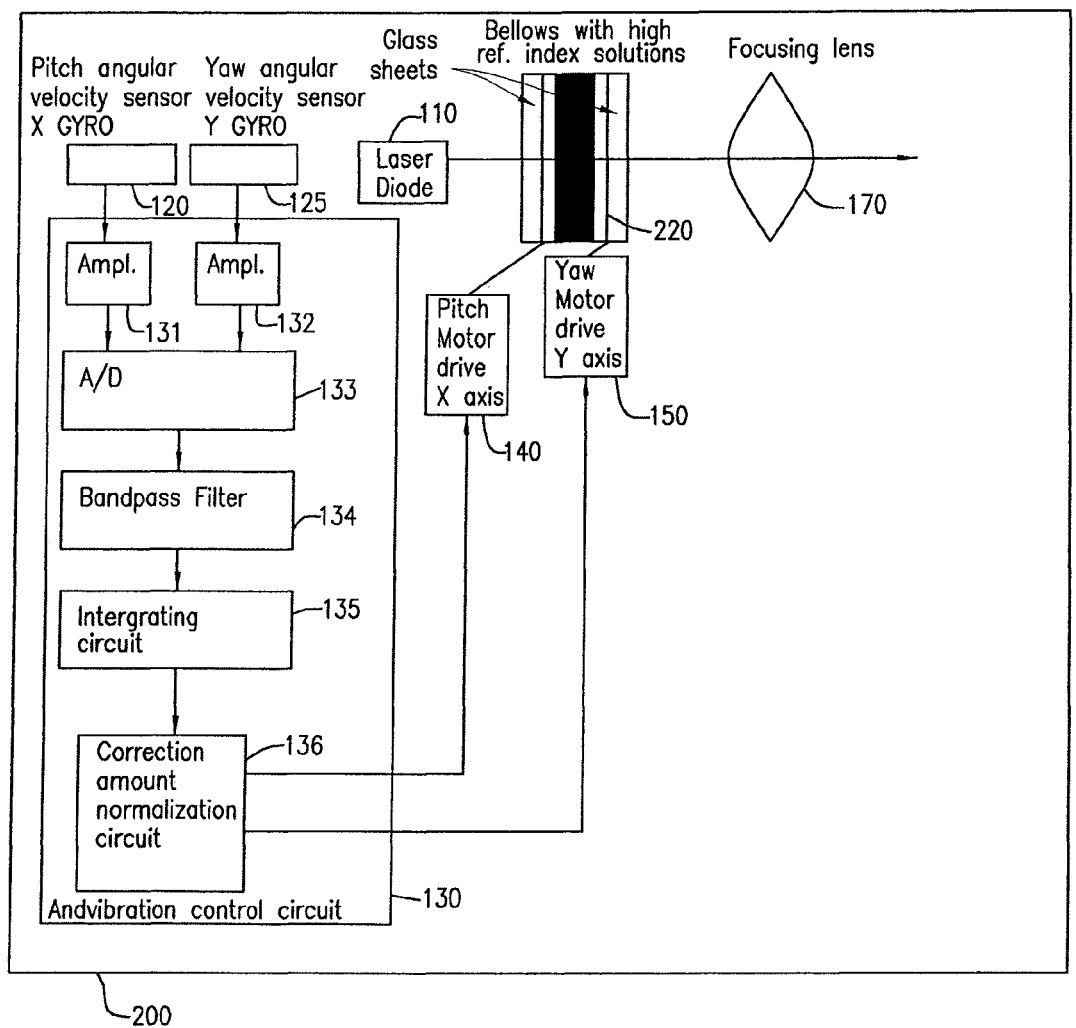
FIG. 3 is a diagram of a motion-compensating light-emitting apparatus according to another embodiment of the present invention.

In another embodiment of the invention, and as shown in FIG. 3, a laser diode pointer 200 may use a movable bellows 210 that may be filled with a high refractive index solution or material 220 instead of corrective movable lens 160. The refractive index of the high refractive index solution or material 220 may be approximately 1.33 or higher. The high refractive index solution or material 220 may be stored between two sheets of glass 230 and 240 such that the portion of the high refractive index solution in the path of the optical beam may be adjusted (by squeezing or spreading the bellows) based on the angular rates measured by the two angular velocity sensors or gyros 120 and 125. Instead of moving an optical lens to change the direction of the exiting beam the bellows filled with high refractive index solution may be contracted on one end and expanded on the other end so as to bend the exiting light beam in a direction opposite to the unwanted motion.

Figure 4:
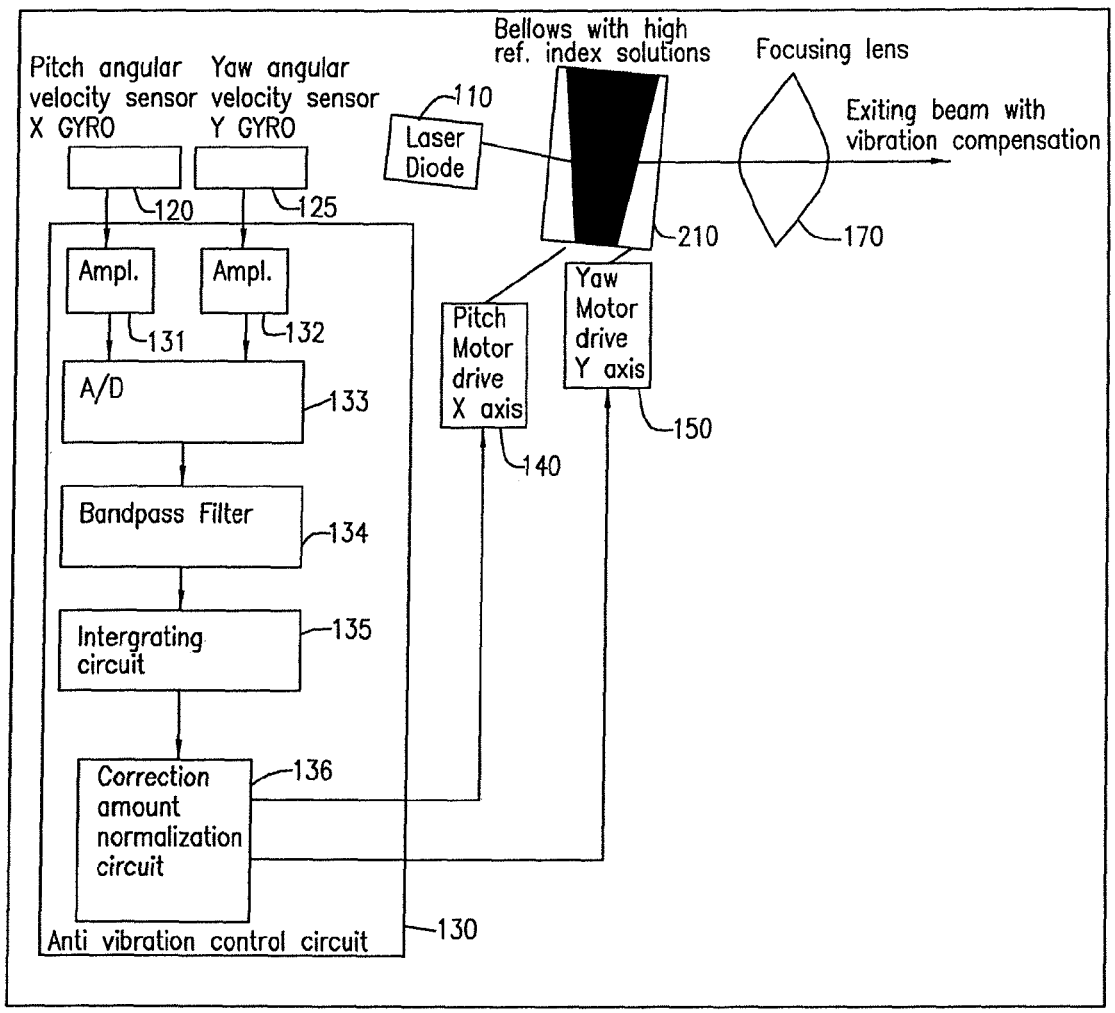
FIG. 4 is a diagram of the motion-compensating light-emitting apparatus of FIG. 3 to which reference will be made in explaining the operation thereof.

FIG. 4 shows how such a change in the thickness or arrangement of the bellows may cause the beam to bend so as to compensate for the unwanted motion. As in the previously described laser pointer having a movable lens, the laser pointer 200 may be powered by a power source such as a number of batteries arranged in a predetermined manner. Additionally, FIGS. 3 and 4 indicate how motion in the pitch or X axis is compensated; however, motion in the yaw or Y axis may be compensated similarly (and independently) and is not illustrated in order to keep the drawings simple and easy to follow.

Figure 5:
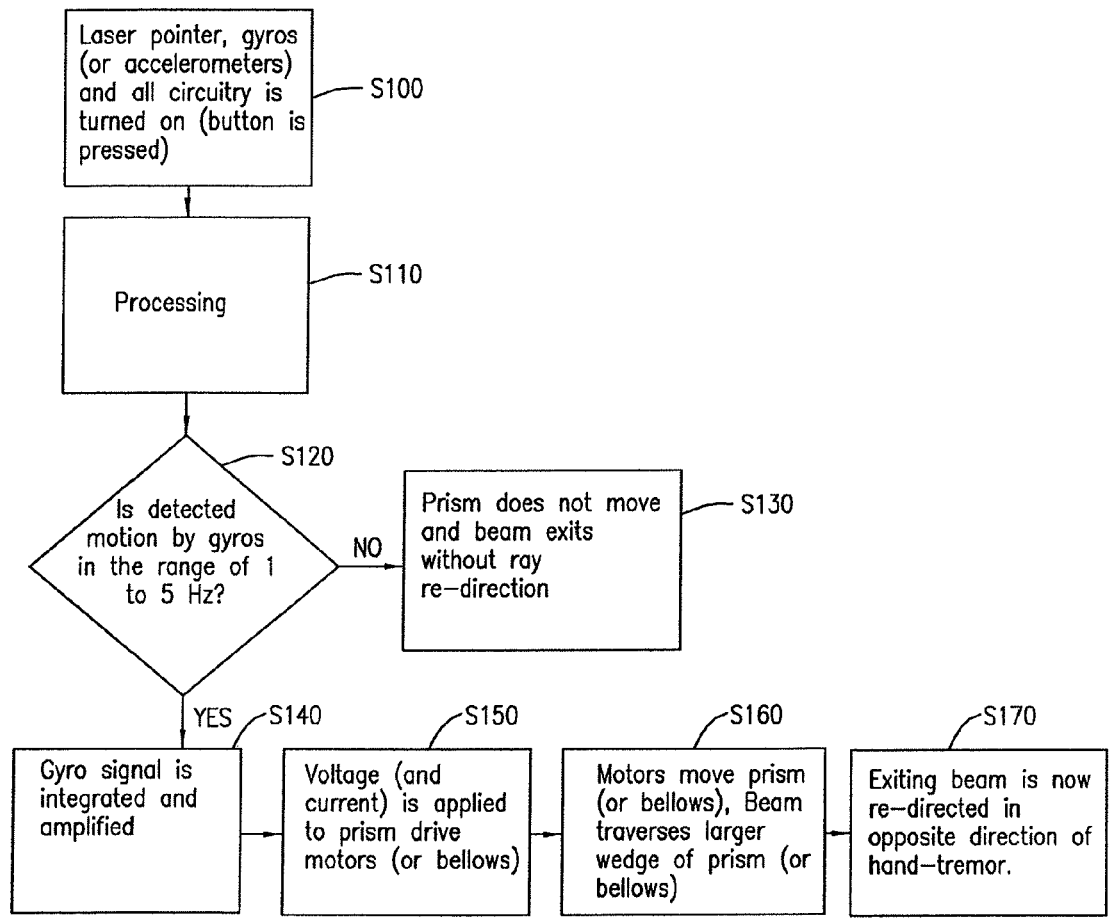
FIG. 5 is a diagram to which reference will be made in explaining the operation of the present apparatus.

FIG. 5 is a flow chart describing how a laser pointer in accordance with an embodiment of the present invention compensates for unwanted motion. The process starts in step S100 where the laser pointer is turned on by pressing a button or the like. During operation of the laser pointer, a sensing means, which may include gyros or accelerometers or a combination thereof, measure movement and output a signal which may be processed by the anti-vibration control circuit. Such processing may include the analog to digital conversion performed by the A/D converter 133. Processing may then proceed to step S120 wherein the signal may be supplied through a band pass filter so as to effectively detect and extract signals corresponding to the unwanted motion of the laser pointer (unwanted motion may be in the 1 to 5 Hz range). If the sensing means does not detect unwanted motion, the method may proceed to step S130 where the correcting lens or bellows is not moved and the beam exits the laser pointer without any redirection. If there is unwanted motion detected by the sensing means, the method proceeds to step S140 where the processed signal may be integrated and/or amplified. A voltage or current corresponding to the processed and/or amplified signal may be applied to the drive motors in step S150, which in turn, may move the prism or the bellows in step S160. In step S170, the beam may be redirected in the direction opposite the direction of the hand tremor.

Figure 6:
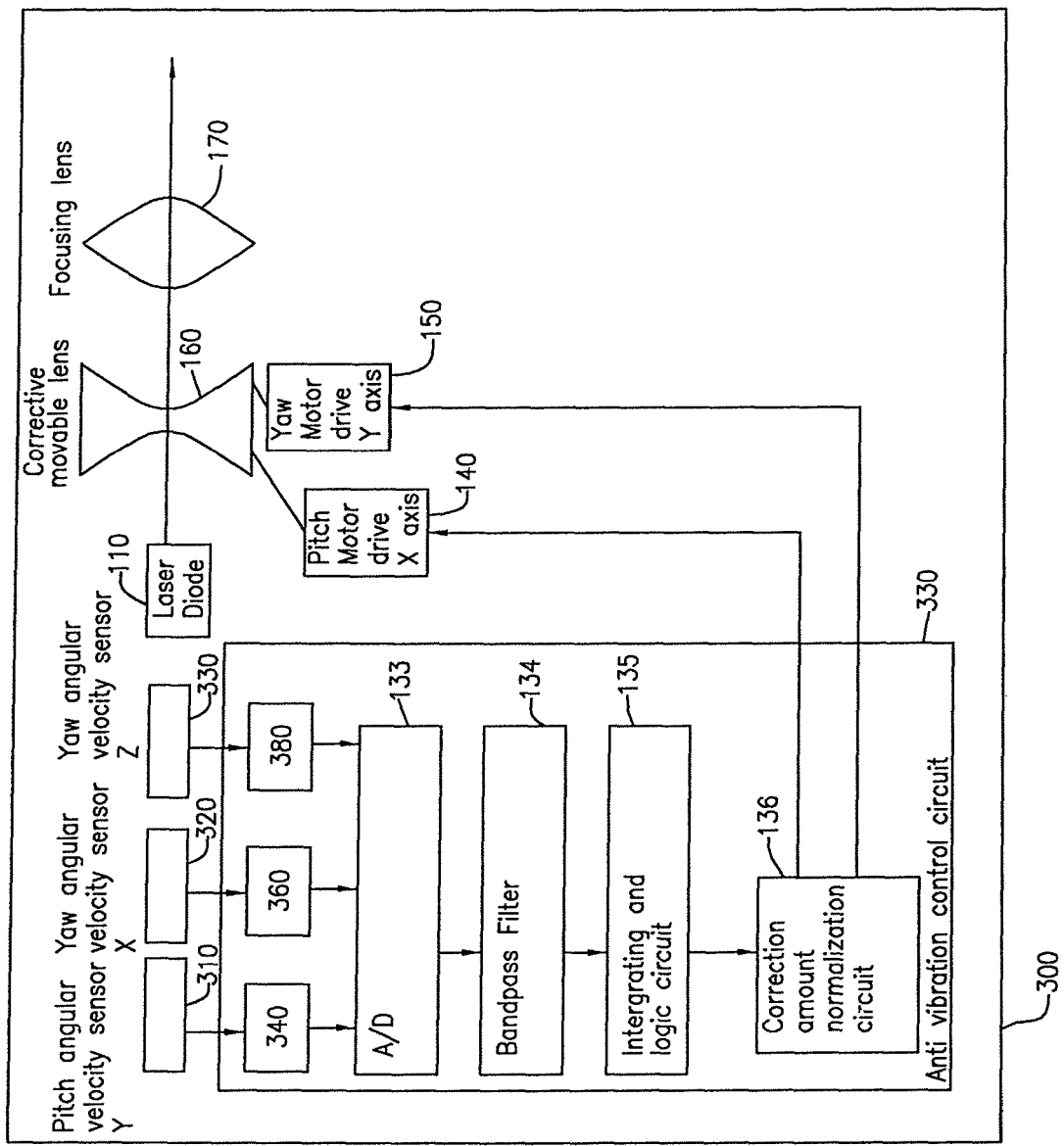
FIG. 6 is a diagram of a motion-compensating light-emitting apparatus according to another embodiment of the present invention.

FIG. 6 is a diagram of another embodiment of the laser diode pointer 300 wherein accelerometers are utilized instead of gyroscopes. Three angular velocity and/or translational motion sensors (accelerometers) 310, 320, and 330, which may be aligned in orthogonal directions, may be used to measure the angular and/or translational movements in the pitch, yaw and roll axis (also referred to as the X, Y and Z axis) respectively. The output of accelerometers 310, 320, and 330 may be respectively amplified by three amplifiers 340, 350, and 360, and then sampled by A/D converter 133 in the anti-vibration control circuit 330. The portion of the signal associated with rapid unwanted angular and/or translational motions of the pointer (e.g., an unwanted hand tremor in the 1-5 Hz range) may be extracted by band pass filter 134 and integrated by integrating processor circuit 135. Movements (tilts) of the laser pointer may be measured by comparing the measured acceleration to a gravity vector (g acceleration) as the laser pointer is tilting and/or computing the motions from the three orthogonal measurements of the acceleration.

The computed integrated rate output (proportional to the angle of the unwanted angular and/or translational motion) may be conditioned (which may include amplifying the signal by a necessary or predetermined amount) and/or used as the input for motor(s) that may be coupled to movable lens 160 located between the laser diode 110 and the focusing lens 170. The anti-vibration circuit 330 may be included in a microprocessor or microcomputer or may be constructed out of individual analog and/or digital elements depending on the cost, size and power consumption requirements.

Figure 7:
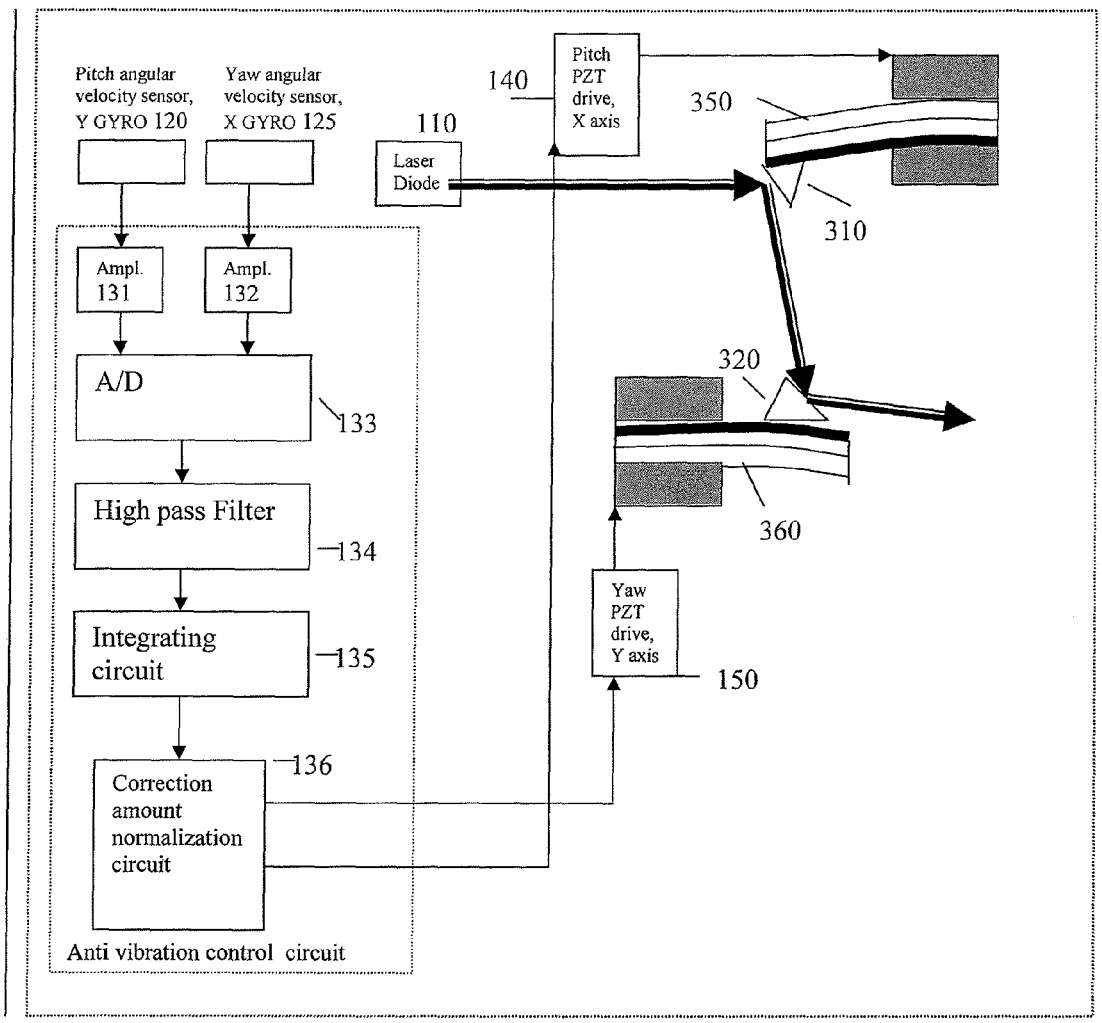
FIG. 7 is a block diagram of a motion-compensated, laser diode pointer utilizing cantilevers.

FIG. 7 is a block diagram of another embodiment of the present invention. A motion-compensated, laser diode pointer illustrated in FIG. 7 comprises a laser emitting diode 110, motion sensors 120, 125, signal amplifiers 131, 132, an A/D converter 133, high pass filter 134, integrating circuit 135, normalization circuit 136, pitch drive 140, yaw drive 150, and mirrors 310 and 320 mounted on cantilevers 350 and 360. Preferably, Bimorph ceramic cantilever strips 350 and 360 comprise Lead Zirconium Titanate (PZT)—metal sandwich strips, or other piezoelectric materials. Cantilevers 350, 360 may be composed of single or multiple elements. Mirrors 310, 320 may be moved by various other means in addition to bimorph ceramic strips of the type used for this application.

In operation, the function of laser emitting diode 110, motion sensors 120, 125, signal amplifiers 131, 132, an A/D converter 133, high pass filter 134, integrating circuit 135, normalization circuit 136, pitch drive 140 and yaw drive 150 are described above and will not be repeated here. Voltage generated by these components are applied to cantilevers 350, 360, causing them to bend and thus to change the angle of mounted mirrors 310, 320. The voltage applied to cantilevers 350, 360 deflects each cantilever proportional to the magnitude of the voltage applied. Mirrors 310 and 320 at the end of cantilevers 350, 360 deflect the laser beam. A mirror deflection of one degree of angle will deflect light by a two degree of angle deflection—one degree of deflection for the incident beam and one degree of deflection for the reflected beam. Thus, moving a mirror is twice as efficient as moving a lens. The amount of deflection may be adjusted based on the angular rates measured by the two motion sensors 120 and 125. Preferably, motion sensors 120, 125 are angular velocity sensors or gyros.

In an alternate embodiment (not illustrated), a set of three to six accelerometers are connected to the body of the laser pointer to measure the unwanted vibrations by measuring the changes of the gravity vector during the unwanted vibration of the laser pointer. Three accelerometers would be the minimum number required and six accelerometers would provide additional accuracy for determining the amount of unwanted vibration present.

Figure 8:
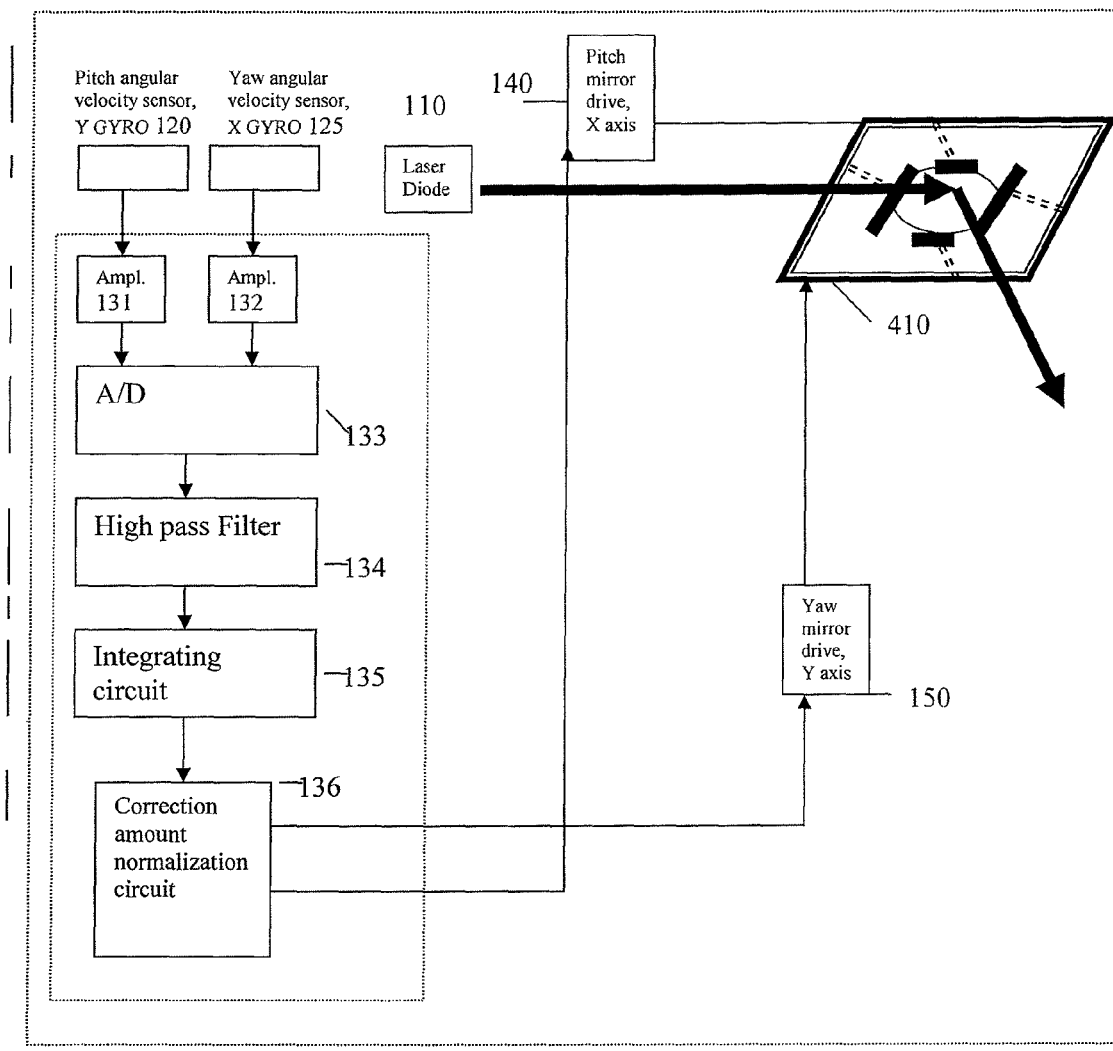
FIG. 8 is a block diagram of a motion-compensated light-emitting apparatus according to another embodiment of the present invention comprising a two axis MEMS based micro mirror.

FIG. 8 is a block diagram of a motion-compensated light-emitting apparatus according to another embodiment of the present invention comprising a two axis MEMS based micro mirror. As illustrated in FIG. 8, the system includes a two axis MEMS micro mirror 410, in addition to the aforementioned components laser emitting diode 110, motion sensors 120, 125, signal amplifiers 131, 132, an A/D converter 133, high pass filter 134, integrating circuit 135, normalization circuit 136, pitch drive 140, yaw drive 150. Two axis MEMS micro mirror 410 is preferably a commercially available unit, such as from Mirrorcle Technologies Inc., type SO308. The mirror changes angle with respect to the package in a similar manner as large scale galvanometer based optical scanners, except that MEMS micro mirror 410 requires several orders of magnitude less driving power. In addition, micro mirrors devices that change in both deflection axes are readily available in a single miniature device that is very compact, typically smaller than 8 mm×14 mm×2 mm.

In operation, the function of laser emitting diode 110, motion sensors 120, 125, signal amplifiers 131, 132, an A/D converter 133, high pass filter 134, integrating circuit 135, normalization circuit 136, pitch drive 140 and yaw drive 150 are described above and will not be repeated here. In this embodiment, the angle of mirror 410 can be controlled independently in each of two axes (X and Y) by the applied voltage from independent mirror drives 140 and 150. Mirror 410 will deflect the beam proportional to the applied voltage in each axis. The amount of deflection may be adjusted based on the angular rates measured by the motion sensors 120 and 125. A voltage applied to the MEMS micro mirror tilts to change the angle of mirror 410. As described above, moving a mirror is twice as efficient as moving a lens. Thus, with a mirror deflection of one degree of angle, the light is deflected two degrees—one degree of deflection for the incident beam and one degree of deflection for the reflected beam.

In an alternate embodiment (not illustrated), a set of three to six accelerometers are connected to the body of the laser pointer to measure the unwanted vibrations by measuring the changes of the gravity vector during the unwanted vibration of the laser pointer. Three accelerometers would be the minimum number required and six accelerometers would provide additional accuracy for determining the amount of unwanted vibration present.

Figure 9:
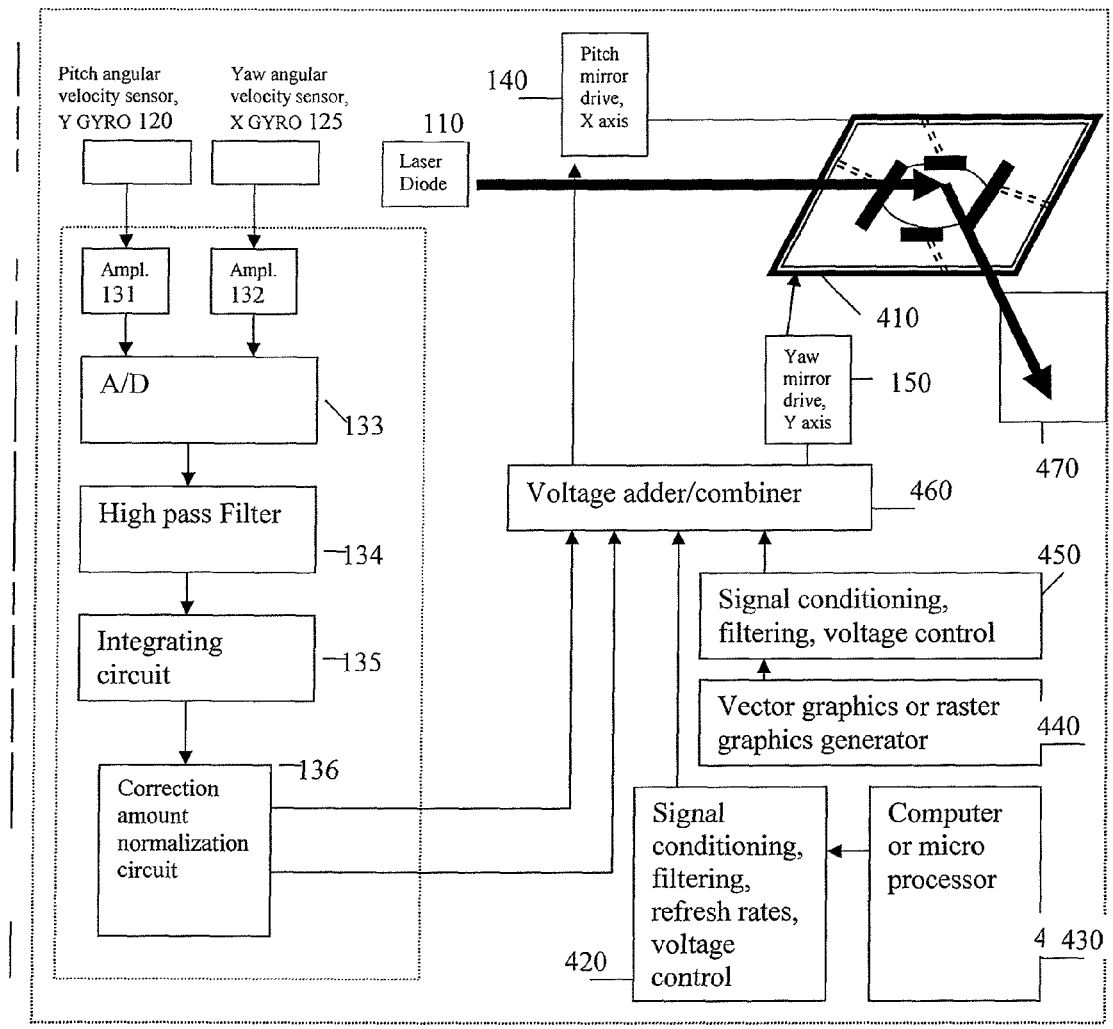
FIG. 9 is a block diagram illustrating a motion-compensated light-emitting device for displaying a variety of stabilized rasterized and stabilized vector graphics as well as stabilized multi-frame animations at arbitrary refresh rates.

FIG. 9 is a block diagram illustrating a motion-compensated light-emitting device for displaying a variety of stabilized rasterized and stabilized vector graphics as well as stabilized multi-frame animations at arbitrary refresh rates. As illustrated in FIG. 9, the system comprises laser emitting diode 110, motion sensors 120, 125, signal amplifiers 131, 132, an A/D converter 133, high pass filter 134, integrating circuit 135, normalization circuit 136, pitch drive 140, yaw drive 150 and a two axis MEMS micro mirror 410, all of which are described above. In addition, the system comprises a signal conditioning filtering and voltage control device 420, a computer or microprocessor 430, a self contained vector graphics or raster graphics generator 440, a signal conditioning, filtering and voltage control unit 450 and a voltage adder 460, which are used to generate a projected image 470, for example, a symbol, letter, or figure.

Image 470 is represented by a low level signal that is transmitted to a signal conditioning, filtering and voltage control device 420 by computer 430. Device 420 sends its output signal to a voltage adder 460 that combines this output signal with the motion compensation signal from normalization circuit 136, to stabilize the projection of image 470. In another embodiment, a self contained vector graphics or raster graphics generator 440 can be self contained within the proposed laser pointer system. The signal output of generator 440 is sent to a signal conditioning, filtering and voltage control unit 450 to ensure the proper dimensioning of the projected image 470. Signal conditioning, filtering, voltage control system 450 sends an output signal to the voltage adder/combiner 460. After the voltages for the vibration stabilization 136 and the generation of the image 470 have been combined, the signals are provided as input to the respective X and Y axis mirror drive units 140 and 150. By superposition, the resulting system projects the desired rasterised or vector graphic with the motion reduction signal in a manner that would not be possible without the vibration stabilization portion as often the resulting projection would be unrecognizable or unreadable because of laser beam jitter.

The system is highly adaptable to projection onto various surfaces and in a variety of applications, including projection onto specially-coated transparent surfaces. Due to the low power consumption and vibration stabilized output of this device, the system is highly portable, especially mobile when used with a laptop small computer. A computer can be used for a generator 440 to project different letters, symbols, or graphics or other static or moving images 470 that can change and evolve over time as well as be a function of the material that is presented.

In an alternate embodiment (not illustrated), a set of three to six accelerometers are connected to the body of the laser pointer to measure the unwanted vibrations by measuring the changes of the gravity vector during the unwanted vibration of the laser pointer. Three accelerometers would be the minimum number required and six accelerometers would provide additional accuracy for determining the amount of unwanted vibration present.

Figure 10:
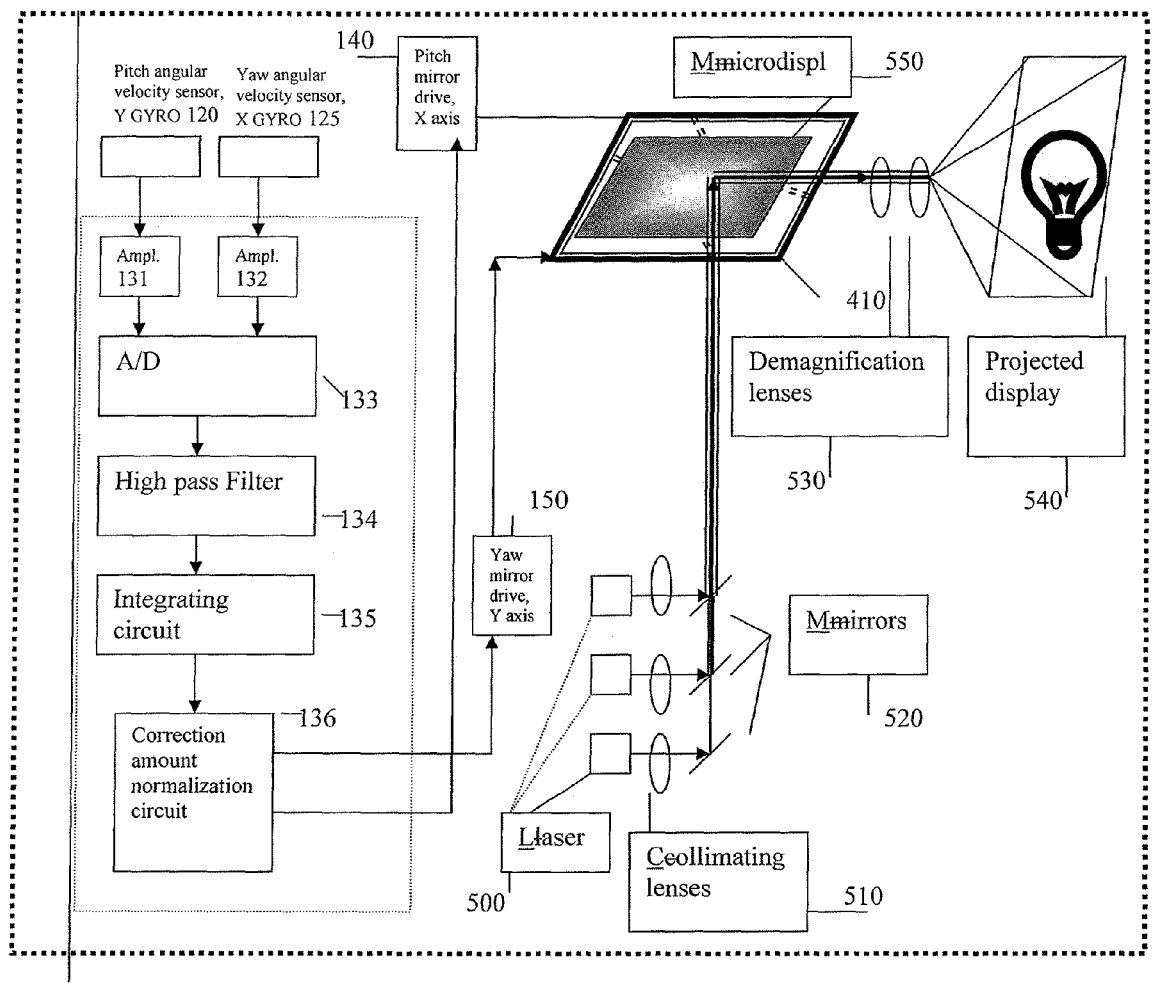
FIG. 10 is a block diagram of a motion-compensated, holographic laser projector.

FIG. 10 is a block diagram of a motion-compensated, holographic laser projector. As illustrated in FIG. 10, a motion-compensated projection device is provided comprising motion sensors 120, 125, signal amplifiers 131, 132, an A/D converter 133, high pass filter 134, integrating circuit 135, normalization circuit 136, pitch drive 140, yaw drive 150 and a two axis MEMS micro mirror 410, all of which are described above. In addition, the system comprises lasers 500, collimating lenses 510, mirrors 520, demagnification lenses 530, projected display 540 and micro display 550.

The motion-compensated projection device displays full color, high-quality images that remain in focus at all distances using holographic laser projection technology. The term "holographic" refers not to the projected image, but to the method of projection. Three lasers of magenta, blue and green color 500 each generate a laser beam that is collimated by individual lenses 510. The beams are reflected and combined into a single beam by three mirrors 520. The combined beam is then reflected off micro display 550. A diffraction pattern of the desired 2D image, calculated using holographic algorithms, is displayed on this phase-modulating Liquid Crystal on Silicon (LCOS) micro display 550 that is attached on top of a two axis MEMS micro minor 410. When illuminated by coherent laser light, the desired image 540 is projected on various surfaces without being distorted by the micro-tremors of the projection system.

Rather than blocking light, the phase-modulating LCOS micro display 550 mounted on MEMS micro minor 410 steers the light to exactly where it is needed, making the system highly efficient. By combining the holographic laser projection technology with the vibration reduction technique a projection system is created that projects images without also projecting the various vibrations and tremors of the projection system or the support structure of the projection system. The resulting system projects the desired image in a manner that would not be possible without the vibration stabilization portion as often the resulting projection would be of much lower quality, unrecognizable or unreadable because of laser beam jitter, or jitter in all elements used to project the image on the desired surface.

Unlike conventional projection systems, this type of technology does not require a projection lens. Instead, a demagnification lens pair expands the diffracted image from the micro display, producing an ultra-wide throw angle greater than 100°. The projected images are in focus at all distances from the projector, eliminating the need for a focus control. The diffractive method of projection naturally lends itself to miniaturization and low cost implementation. It allows images to be projected onto curved and angled surfaces without distortion, and is highly tolerant to micro display pixel failure—essential in safety critical applications in markets such as automotive.

In an alternate embodiment (not illustrated), a set of three to six accelerometers are connected to the body of the laser pointer to measure the unwanted vibrations by measuring the changes of the gravity vector during the unwanted vibration of the laser pointer. Three accelerometers would be the minimum number required and six accelerometers would provide additional accuracy for determining the amount of unwanted vibration present.

Figure 11:
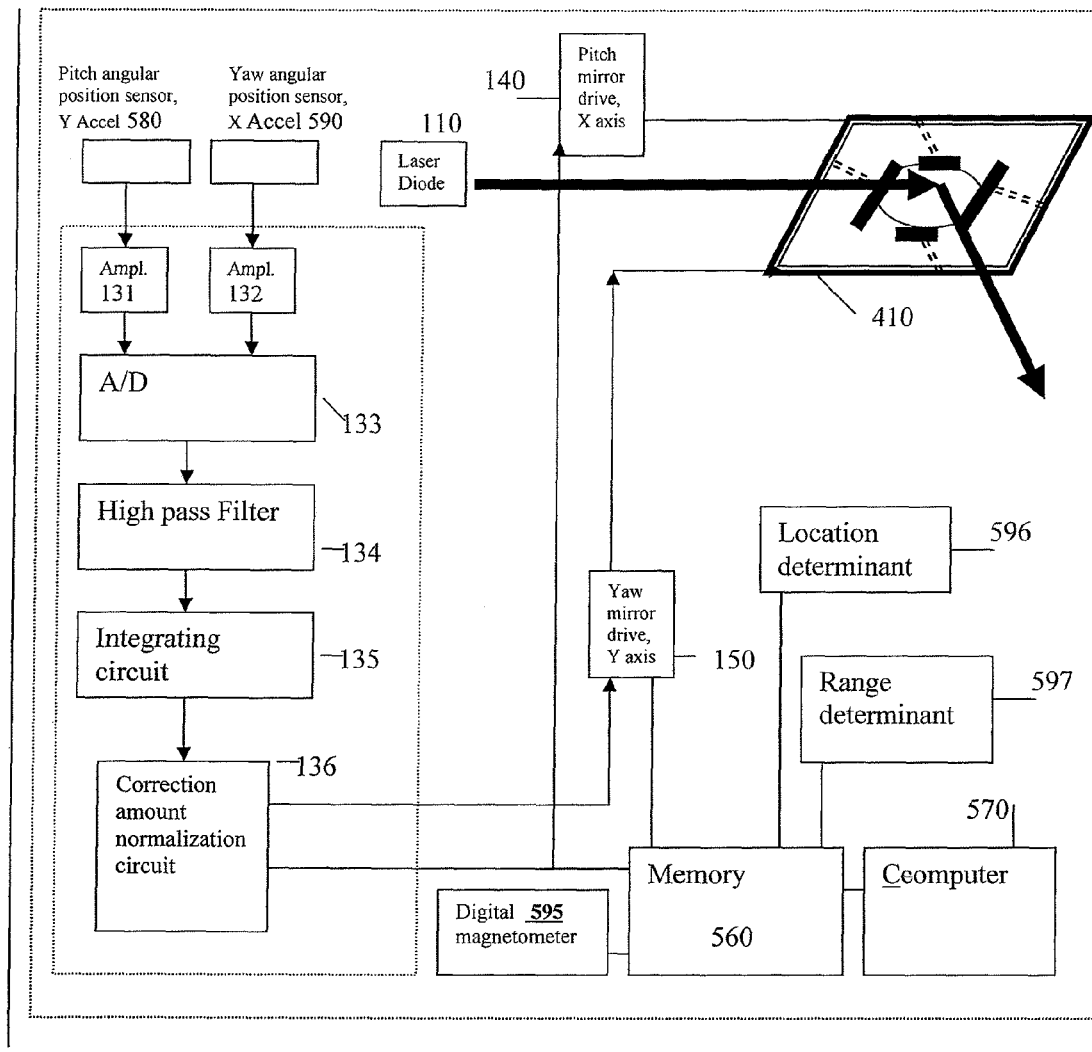
FIG. 11 is a block diagram of a motion and position compensated laser pointer.

FIG. 11 is a block diagram of a motion and position compensated laser pointer. As illustrated in FIG. 11, the system comprises laser emitting diode 110, signal amplifiers 131, 132, an A/D converter 133, high pass filter 134, integrating circuit 135, normalization circuit 136, pitch drive 140, yaw drive 150 and a two axis MEMS micro mirror 410, all of which are described above. In a preferred embodiment, the system further comprises a memory 560, a computer 570, X and Y accelerometers 580 and 590, a digital magnetometer 595, a location indicator 596 and a range indicator 597.

The motion-compensated projection device stores in memory 560 the orientation of the laser or projection system at times directed by the user. For example, the user may mark a target by pressing a button (not shown). Signals from two angular position and/or translational motion sensors or accelerometers, in the X and Y orientation 580 and 590 and a digital magnetometer 595 (for azimuth orientation) indicate the orientation of the laser pointer when the user so indicates. In addition, location indicator 596 and range indicator 597 provide position and range to target information that is stored in memory 560 for later retrieval. Memory 560 is accessed by computer 570. In an alternative method of operation, the desired positions could be downloaded from computer 570 into memory 560. The system maintains the laser pointed in the marked orientation. In addition, several points can be marked in sequence, and the laser can scan and point at them in a round-robin fashion.

In an alternate embodiment (not illustrated), a set of three to six accelerometers are connected to the body of the laser pointer to measure the unwanted vibrations by measuring the changes of the gravity vector during the unwanted vibration of the laser pointer. Three accelerometers would be the minimum number required and six accelerometers would provide additional accuracy for determining the amount of unwanted vibration present.

Having thus described at least illustrative embodiments of the invention, various modifications and improvements will readily occur to those skilled in the art and are intended to be within the scope of the invention. Accordingly, the foregoing description is by way of example only and is not intended as limiting.

Although the above embodiments describe laser pointers that may utilize specific combinations of gyroscopes or accelerometers, the present invention is not so limited. For example, the present invention may also utilize other types of motion sensing devices or may utilize a different number of gyroscopes or accelerometers or may utilize a combination of gyroscopes and accelerometers to sense unwanted motion. In addition, although a "light beam" is recited, the invention shall not be limited to a ray of visible light, but shall also encompass other forms of electromagnetic radiation that can be reflected or refracted, as is well known in the art, such as infrared, ultraviolet, or even x-ray or other non-visible radiation. Although preferred embodiments of the present invention and modifications thereof have been described in detail herein, it is to be understood that this invention is not limited to those precise embodiments and modifications, and that other modifications and variations may be effected by one skilled in the art without departing from the spirit and scope of the invention as defined by the appended claims.

We claim:

1. A light-emitting apparatus comprising:
   a light beam generator that emits a light beam;
   a device that produces a first signal indicating motion of the generator;
   an integrator that integrates the first signal to produce a second signal indicating movement of the light beam generator; and
   a light diverting device mounted to an electronically adjustable cantilever;
   wherein the second signal is applied to the cantilever so that the light beam projects substantially in a particular direction.

2. The apparatus of claim 1, wherein the cantilever comprises a first layer of ceramic and a second layer of lead zirconium titanate.

3. The apparatus of claim 2, further comprising:
   first and second angular rate-sensing devices; and
   first and second cantilevers;
   wherein the first angular rate-sensing device measures pitch angular velocity and the second angular rate-sensing device measures yaw angular velocity, the integrator integrates signals produced by both first and second signals and the integrated signals are applied to the first and second cantilevers, respectively.

4. The apparatus of claim 3, further comprising:

a graphics generator that generates a third signal; and a signal combiner that combines the first and second signals with the third signal;

wherein the third signal, applied to the cantilevers, diverts the light beam to project an image.

5. The apparatus of claim 3, further comprising:

a user interface that selects a current orientation of the generator; and a memory that stores the current orientation;

wherein the apparatus maintains the light beam projected at the current orientation.

6. The apparatus of claim 5, further comprising a measurement device that generates a third signal representative of a measured orientation and wherein the memory further stores the measured orientation.

7. The apparatus of claim 6, wherein the measurement device comprises a digital magnetometer and the measured orientation is azimuth.

8. The apparatus of claim 7, wherein the memory stores more than one orientation and the apparatus directs the beam in a sequence of one or more directions from the orientations stored in the memory.

9. The apparatus of claim 1, wherein the light diverting device comprises a mirror.

10. The apparatus of claim 1, wherein the light diverting device comprises a lens.

11. The apparatus of claim 1, wherein the integrator integrates the first signal to produce a second signal that indicates an angular and translational movement of the light beam generator; and;

wherein the second signal is applied to the cantilever so that angular and translational movement is substantially eliminated.

* * * * *